(12) United States Patent
Sakai et al.

(10) Patent No.: US 8,735,926 B2
(45) Date of Patent: May 27, 2014

(54) SEMICONDUCTOR LIGHT EMITTING DEVICE AND MANUFACTURING METHOD OF THE SAME

(71) Applicant: Stanley Electric Co., Ltd., Tokyo (JP)

(72) Inventors: Takaaki Sakai, Kashiwa (JP); Takeshi Waragaya, Yokohama (JP)

(73) Assignee: Stanley Electric Co., Ltd., Tokyo (JP)

( * ) Notice: Subject to any disclaimer, the term of this patent is extended or adjusted under 35 U.S.C. 154(b) by 0 days.

(21) Appl. No.: 13/679,212

(22) Filed: Nov. 16, 2012

(65) Prior Publication Data

US 2013/0126926 A1    May 23, 2013

(30) Foreign Application Priority Data

Nov. 21, 2011   (JP) .................................. 2011-253442

(51) Int. Cl.
*H01L 33/00* (2010.01)
(52) U.S. Cl.
USPC ............................................................ 257/98
(58) Field of Classification Search
CPC ......... H01L 33/60; H01L 33/58; H01L 33/62; H01L 33/50; H01L 33/36
USPC .......................... 257/177–182, 276, 457, 459, 257/E33.056–E33.059, E25.032, 186, 257/E31.005, 749, 13, 79–103, 918, 257/E51.018–E51.022; 438/22–47, 69, 438/493, 503, 507, 956, 208, 912, 51, 55, 438/64–68, 83, 98
See application file for complete search history.

(56) References Cited

U.S. PATENT DOCUMENTS

| 7,710,016 | B2 * | 5/2010 | Miki et al. ..................... 313/502 |
| 7,847,302 | B2 * | 12/2010 | Basin et al. ..................... 257/88 |
| 8,461,610 | B2 * | 6/2013 | Ito et al. ........................... 257/98 |
| 8,541,801 | B2 * | 9/2013 | Kim et al. ........................ 257/98 |
| 2007/0262341 | A1 * | 11/2007 | Liu et al. ........................ 257/103 |
| 2009/0184333 | A1 * | 7/2009 | Wang et al. ...................... 257/88 |
| 2010/0193822 | A1 * | 8/2010 | Inobe et al. ..................... 257/98 |
| 2011/0001161 | A1 * | 1/2011 | Park et al. ........................ 257/98 |
| 2011/0175117 | A1 * | 7/2011 | Jagt et al. ........................ 257/88 |
| 2012/0236582 | A1 * | 9/2012 | Waragaya et al. ............. 362/510 |
| 2013/0087823 | A1 * | 4/2013 | Tsai et al. ........................ 257/98 |

FOREIGN PATENT DOCUMENTS

| JP | 09-153645 A | 6/1997 |
| JP | 2010-092897 A | 4/2010 |

* cited by examiner

*Primary Examiner* — Dao H Nguyen
*Assistant Examiner* — Tram H Nguyen
(74) *Attorney, Agent, or Firm* — Holtz, Holtz, Goodman & Chick, PC

(57) ABSTRACT

A semiconductor light emitting device which has a wavelength converting part on a semiconductor film and can eliminate unevenness in emission color without a reduction in light output. The semiconductor film includes a light emitting layer. The support substrate is bonded to the semiconductor film via a light-reflecting layer and has a support surface supporting the semiconductor film and edges located further out than the side surfaces of the semiconductor film. The light-shielding part covers the side surfaces of the semiconductor film and part of the support surface around the semiconductor film in plan view. The wavelength converting part contains a fluorescent substance and is provided over the support substrate to bury the semiconductor film and the light-shielding part therein. The wavelength converting part has a curved surface shape in which its thickness increases when going from the edges toward the center of the semiconductor film.

19 Claims, 9 Drawing Sheets

SEMICONDUCTOR LIGHT EMITTING DEVICE AND MANUFACTURING METHOD OF THE SAME

BACKGROUND OF THE INVENTION

1. Field of the Invention

The present invention relates to a semiconductor light emitting device including a light emitting element such as an LED (light emitting diode).

2. Description of the Related Art

Light emitting diodes (hereinafter called LEDs) are used in car tail lamps, various displays, the backlights of mobile devices such as mobile phones, and so on. The demand for LEDs for car headlights, the backlights of liquid crystal displays, and general lighting is expected to increase greatly from now on. For car headlights and general lighting, white light is desirable. The color of light of the LED is determined by the magnitude of the band gap of the semiconductor layer and is intrinsic to the semiconductor crystal used. Hence, the color of light of the LED is a single color such as red, green, or blue. The methods for obtaining white light using LEDs of this light-emitting characteristic are as follows.

The first method is to arrange a red LED, a green LED, and a blue LED and make them emit light at the same time. However, in the case of this method, color unevenness may be likely to occur depending on the viewing direction because of the strong directivity characteristic of LEDs. Further, because the rate at which the LED varies with an environmental factor such as temperature is different between the LEDs of respective different colors and the speed at which the LED deteriorates is also different, it is difficult to maintain the white color.

The second method is to combine a blue LED and a yellow fluorescent substance, thereby obtaining white light. The fluorescent substance absorbs blue light to emit yellow light of a longer wavelength. Part of blue light emitted from the blue LED is converted by the fluorescent substance into yellow light, and the other part passes through a fluorescent substance layer including the fluorescent substance with maintaining its blue color. The yellow light emitted from the fluorescent substance and the blue light are mixed to produce white light. According to this method, white light can be obtained with use of a single blue LED chip, and hence the device is simple in configuration and can be manufactured at lower cost than by the above first method wherein LEDs of emission colors of RGB are arranged.

CITATION LIST

Patent Literature

PTL 1: Japanese Patent Kokai No. H09-153645
PTL 2: Japanese Patent Kokai No. 2010-92897

SUMMARY OF THE INVENTION

Among methods of providing a fluorescent substance on an LED chip, there is a method which coats a wavelength converting material made of light-transmissive resin having fluorescent substance particles dispersed therein over the upper surface of a semiconductor film by a dispenser. By this method, a wavelength converting part is formed, thereby making the wavelength converting part be in a curved surface shape like a dome, and thus the occurrence of emission color unevenness between the middle and the periphery of the light emitting surface can be prevented. However, when the method which coats a wavelength converting material over the upper surface of a semiconductor film is used, the wavelength converting part does not spread sufficiently into the corners of the surface of the semiconductor film, or portions of the wavelength converting part covering the corners become very small in thickness. Hence, light emitted from the corners of the semiconductor film can hardly include yellow light from the fluorescent substance. Thus, blue light is emitted from the corners of the semiconductor film, resulting in the occurrence of unevenness in emission color.

The above PTL 2 describes providing a light-shielding part in each corner of the semiconductor film surface to make the blue light-emitting portion non-light emissive in order to solve this problem. However, if a light-shielding part is provided over part of the principal light emitting surface of the semiconductor film, the area of the light-emitting part is reduced, resulting in a reduction in light flux and brightness.

The present invention was made in view of the above facts, and an object thereof is to provide a semiconductor light emitting device which has the wavelength converting part on the semiconductor film and which can eliminate unevenness in emission color without a reduction in light output.

A semiconductor light emitting device according to the present invention comprises a semiconductor film including a light emitting layer; a support substrate bonded to the semiconductor film via a light-reflecting layer and having a support surface supporting the semiconductor film and edges located further out than the side surfaces of the semiconductor film; a light-shielding part that covers the side surfaces of the semiconductor film and part of the support surface extending outside the semiconductor film in plan view; and a wavelength converting part containing a fluorescent substance and provided over the support substrate to bury the semiconductor film and the light-shielding part therein. The wavelength converting part has a curved surface shape in which its thickness increases when going from the edges toward the center of the semiconductor film.

A manufacturing method of a semiconductor light emitting device according to the present invention comprises the steps of preparing a light emitting element that includes a semiconductor film including a light emitting layer, and a support substrate bonded to the semiconductor film via a light-reflecting layer and having a support surface supporting the semiconductor film and edges located further out than the side surfaces of the semiconductor film; supplying light-shielding material between the side surfaces of the semiconductor film and the edges to form a light-shielding part to cover the side surfaces of the semiconductor film; and after forming the light-shielding part, coating a wavelength converting material containing a fluorescent substance over the semiconductor film so as to spread to the edges, thereby forming a wavelength converting part to bury the semiconductor film therein.

In the semiconductor light emitting device and the manufacturing method thereof according to the present invention, the edges of the support substrate are located outside the semiconductor film in plan view, and the wavelength converting part extends to the edges of the support substrate, and hence the wavelength converting part has enough thickness at its portions on the corners of the semiconductor film, so that unevenness in emission color can be eliminated in the corners of the semiconductor film. Further, the light-shielding part cuts off light emission from the side surfaces of the semiconductor film and forms a sloping surface to lead unnecessary fluorescent substance particles to outer positions far from the semiconductor film so that the excitation of them does not occur. Hence, color unevenness in the area around the semiconductor film can also be prevented. Further, the light-shielding part is made of light-reflective material, thus improving light output.

DETAILED DESCRIPTION OF THE INVENTION

Figure 1A:
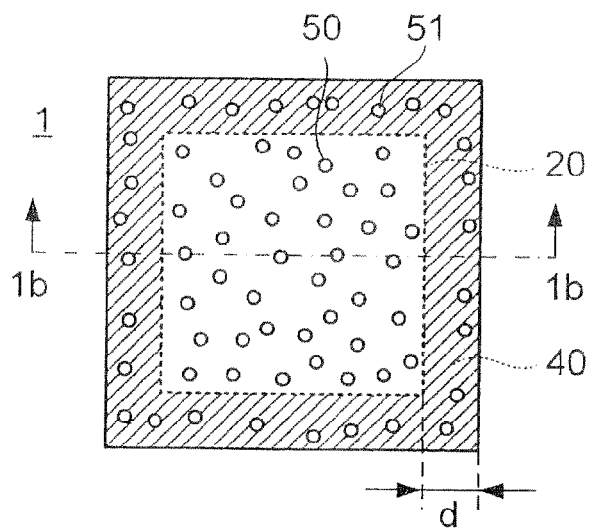
FIG. 1A is a top view of a semiconductor light emitting device according to an embodiment of the present invention.

Embodiments of the present invention will be described below with reference to the drawings. The same reference numerals are used to denote substantially the same or equivalent constituents and parts throughout the figures cited below.

Embodiment 1

Figure 1B:
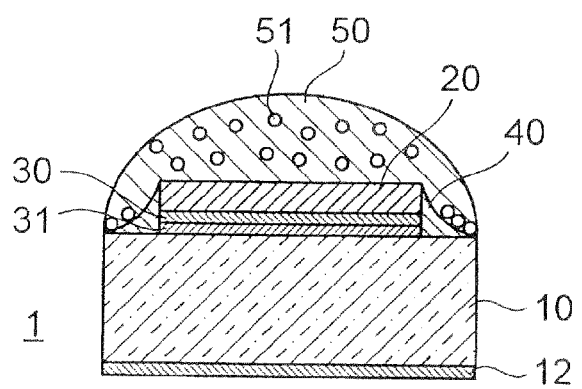
FIG. 1B is a cross-sectional view taken along line 1b-1b in FIG. 1A.
Figure 1C:
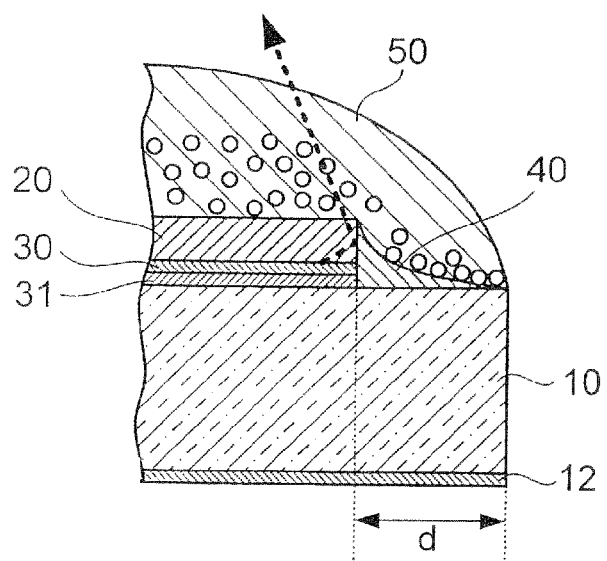
FIG. 1C is a cross-sectional view of part of the semiconductor light emitting device according to the embodiment of the present invention.

FIG. 1A is a top view of a semiconductor light emitting device 1, seen from the light extraction surface side, according to Embodiment 1 of the present invention; FIG. 1B is a cross-sectional view taken along line 1b-1b in FIG. 1A; and FIG. 1C is a cross-sectional view of part of the semiconductor light emitting device 1.

A support substrate 10 is made of, for example, a conductive semiconductor, such as Si, of about 100 μm thickness and supports a semiconductor film 20, forming a current path to inject a current into the semiconductor film 20. The support surface of the support substrate 10 supporting the semiconductor film 20 has a square shape with a side length of, e.g., about 1,150 μm. The support substrate 10 is opaque to light emitted from the light emitting layer, so that light is not emitted through the side surfaces of the support substrate 10. The support substrate 10 is bonded to the semiconductor film 20 via a light reflecting layer 30 made of, e.g., Ag having relatively high reflectivity and a bonding layer 31 containing a eutectic bonding material such as AuSn. The light reflecting layer 30 forms a light-reflecting surface at its interface with the semiconductor film 20 and reflects light emitted from the light emitting layer toward the light-extraction surface side. A back surface electrode 12 made of, e.g., Pt is provided on the back surface of the support substrate 10. Note that the support substrate 10 may be made of other material having both mechanical strength adequate to support the semiconductor film 20 and conductivity (for example, metal).

The semiconductor film 20 is configured with an n-type semiconductor layer, a light emitting layer, and a p-type semiconductor layer laid one over another, which are made of, for example, group III nitride-based semiconductors, and blue light having a wavelength of, e.g., about 460 nm is generated in the light emitting layer. The principal surface of the semiconductor film 20 has a square shape with a side length of, e.g., about 1,050 μm, and the thickness thereof is about 5 μm. The semiconductor film 20 is bonded to the support substrate 10 via the light reflecting layer 30 and the bonding layer 31 and is placed in the center of the support surface of the support substrate 10. The support surface of the support substrate 10 is larger in size than the principal surface of the semiconductor film 20, and the edges of the support substrate 10 are located further out than the side surfaces of the semiconductor film 20. The distances d between the side surfaces of the semiconductor film 20 and the edges of the support substrate 10 are each about 100 μm. A bonding pad (not shown) via which to connect a bonding wire to the semiconductor film 20 is provided on the upper surface of the semiconductor film 20.

A light-shielding part 40 covers the side surfaces of the semiconductor film 20 to cut off light emission at the side surfaces of the semiconductor film 20. The light-shielding part 40 is constituted by light-reflective white resin made of, e.g., silicone resin of a relatively low refractive index having light-scattering material such as $TiO_2$ dispersed therein. Note that epoxy resin, hybrid resin that is a mixture of silicone resin and epoxy resin, or urethane resin can be used as the resin material and that $Al_2O_3$ or the like can be used as the light-scattering material. The light-shielding part 40 is preferably light reflective from the viewpoint of improving light output, but may be made of a light-absorbing (low-reflective) material (for example, black resin). The light-shielding part 40 is provided to surround the periphery of the semiconductor film 20 so as to cover the side surfaces of the semiconductor film 20 and part of the support surface of the support substrate 10 outside the semiconductor film 20 in plan view. The light-shielding part 40 extends from the side surfaces of the semiconductor film 20 to the edges of the support substrate 10, forming a sloping surface sloping down from the side surfaces of the semiconductor film 20 toward the edges of the support substrate 10. The sloping surface of the light-shielding part 40 is a concave-like curved surface due to surface tension acting on white resin constituting the light-shielding part 40.

A wavelength converting part 50 is constituted by a wavelength converting material made of light-transmissive resin such as epoxy resin or silicone resin having a fluorescent substance 51 dispersed therein. As the fluorescent substance, for example, a yellow luminescent, fluorescent substance $(Y_3Al_5O_{12}:Ce^{3+})$ made by doping YAG with Ce (cerium) as an activator can be used. The fluorescent substance absorbs blue light with a peak wavelength of about 460 nm emitted from the light emitting layer of the semiconductor film 20 to convert this into yellow light with a luminescence peak at around a wavelength of 560 nm. Yellow light emitted from the fluorescent substance and blue light having passed through the wavelength converting part 50 mix together to produce white light emitted from the light extraction surface of the wavelength converting part 50. The wavelength converting part 50 is provided on the support substrate 10 to bury the semiconductor film 20 and the light-shielding part 40 therein. The wavelength converting part 50 extends to the edges of the support substrate 10 and has a curved surface shape like a dome (or a convex) in which the thickness increases when going from the edges of the support substrate 10 toward the center of the semiconductor film 20. This shape of the wavelength converting part 50 can be formed by dropping an appropriate amount of liquid-like wavelength converting material onto the semiconductor film 20. Note that the fluorescent substance to form part of the wavelength converting part 50 is selected according to the emission color of the semiconductor film 20 and that, for example, a green luminescent, fluorescent substance ($Y_3(Al,Ga)_5O_{12}:Ce^{3+}$) or a red luminescent, fluorescent substance ($CaAlSiN_3:Eu$) may be used.

Figure 2:
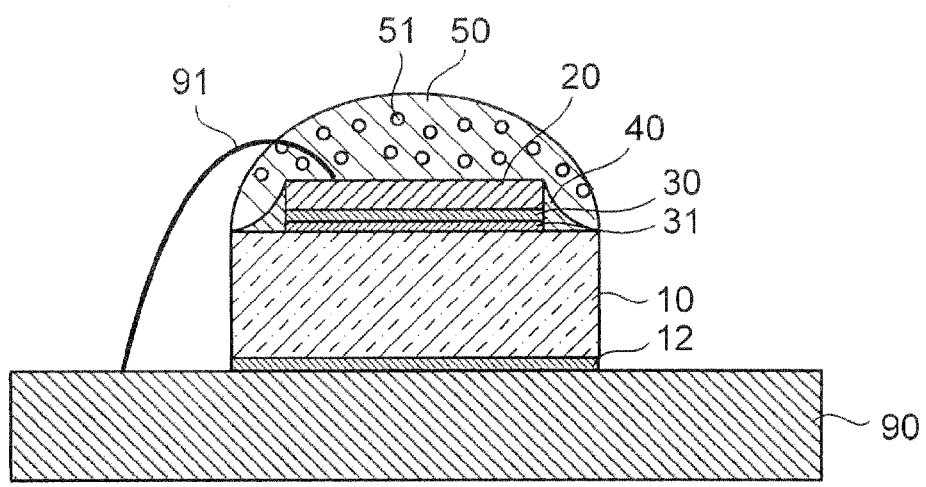
FIG. 2 is a cross-sectional view showing the way that the semiconductor light emitting device according to the embodiment of the present invention is mounted.

FIG. 2 is a cross-sectional view showing the way that the semiconductor light emitting device 1 according to the embodiment of the present invention is mounted. The semiconductor light emitting device 1 is mounted on a package substrate 90. The package substrate 90 is a metal core substrate with, e.g., Cu or Al as base material, a glass epoxy substrate, or a ceramic substrate made of $Al_2O_3$, AlN, or the like. The semiconductor light emitting device 1 is bonded at the back surface electrode 12, as a joint surface, to the package substrate 90 using solder, conductive paste, or the like. A bonding wire 91 electrically connects a bonding pad (not shown) of the semiconductor film 20 and a conductor line (not shown) on the package substrate. The power supply to the semiconductor light emitting device 1 is performed via the package substrate 90.

In the semiconductor light emitting device 1 according to the embodiment of the present invention, since the support substrate 10 has the support surface larger in size than the principal surface of the semiconductor film 20, the edges of the support substrate 10 are located further out than the side surfaces of the semiconductor film 20. The wavelength converting part 50 extends beyond the side surfaces of the semiconductor film 20 to the edges of the support substrate 10, and hence enough thickness is secured even at its portions on the corners of the semiconductor film 20. By this means, the problem that blue light is emitted from the corners of the semiconductor film 20 can be eliminated.

Further, because the side surfaces of the semiconductor film 20 are covered by the light-reflective, light-shielding part 40, light generated in the light emitting layer and directed toward the side surfaces of the semiconductor film 20 is reflected by the light-shielding part 40 as shown in FIG. 1C and emitted through the upper surface of the semiconductor film 20. By this means, when the semiconductor light emitting device 1 according to this embodiment is used as the light source of, e.g., a vehicle lamp whose projection direction is directed in a particular direction, the light output on the optical axis can be improved.

Further, because the support surface of the support substrate 10 extending outside the semiconductor film 20 is covered by the light-reflective, light-shielding part 40, the light output can be further improved. That is, if the base material (e.g., Si) of the support substrate 10 is exposed at the support surface of the support substrate 10 extending outside the semiconductor film 20, then light absorption will occur at the Si surface, thus reducing the light output. By covering the support surface surrounding the semiconductor film 20 with the light-reflective, light-shielding part 40, such light absorption can be suppressed as in this embodiment.

Figure 3:
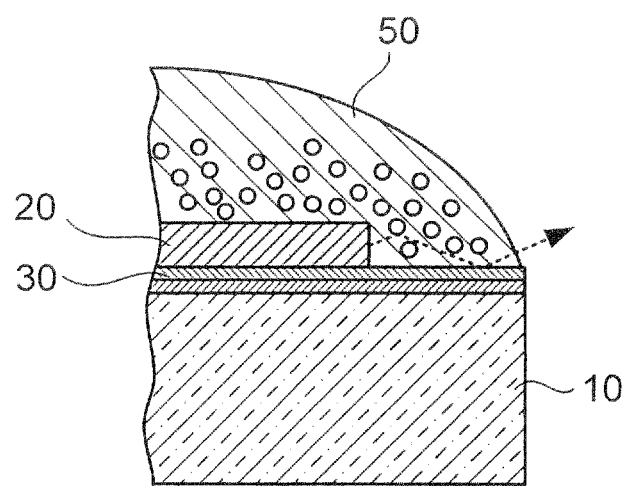
FIG. 3 is a cross-sectional view of a semiconductor light emitting device as a comparative example.

As in the semiconductor light emitting device according to a comparative example shown in FIG. 3, if the side surfaces of the semiconductor film 20 are not covered by a light-shielding material and the support surface of the support substrate 10 extending outside the semiconductor film 20 is covered by light-reflective metal such as Ag having high reflectivity, then light emitted from the side surfaces of the semiconductor film 20 is reflected multiple times between the fluorescent substance and the light-reflective metal, and as a result, strongly yellowish light is emitted from the area around the semiconductor film 20, resulting in the occurrence of unevenness in emission color. As in the semiconductor light emitting device 1 according to the embodiment of the present invention, by cutting off light emission from the side surfaces of the semiconductor film 20 by the light-shielding part 40, the occurrence of such color unevenness can be avoided. Further, the distance d from the side surfaces of the semiconductor film 20 to the edges of the support substrate 10 is sufficiently larger than the average particle diameter (about 30 μm) of the fluorescent substance contained in the wavelength converting part 50, and the light-shielding part 40 has a sloping surface sloping down toward the edges of the support substrate 10. By this means, fluorescent substance particles existing over the area around the semiconductor film 20 move along the sloping surface of the light-shielding part 40 toward the edges of the support substrate 10. That is, fluorescent substance particles existing over the area around the semiconductor film 20 and not contributing to the generation of white light, are led to outer positions lower than the upper surface of the semiconductor film 20 so as not to be irradiated by blue light. As such, unnecessary fluorescent substance particles existing over the area around the semiconductor film 20 and not contributing to the generation of white light are led to a region where excitation does not occur, and hence the excessive generation of yellow light can be prevented in the area around the semiconductor film 20. Note that if the light-shielding part 40 is made of a light-absorbing (low-reflective) material, the above effect of improving the light output will be reduced, but that the effect of reducing unevenness in emission color will be maintained.

A manufacturing method of the semiconductor light emitting device 1 according to the embodiment of the present invention will be described below. FIGS. 4 to 6 are cross-sectional views showing the manufacturing method of the semiconductor light emitting device 1 according to the embodiment of the present invention.

(Semiconductor Film Forming Process)

Figure 4A:
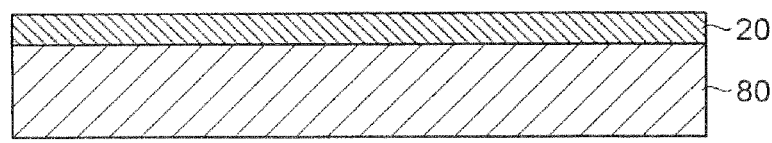
FIGS. 4A to 4D are cross-sectional views showing a manufacturing method of the semiconductor light emitting device according to the embodiment of the present invention.

A sapphire substrate 80 is prepared as a growth substrate over which to grow group III nitride semiconductor crystals. The sapphire substrate 80 is placed in an MOVPE apparatus, and thermal cleaning is performed on the sapphire substrate 80. Then, the semiconductor film 20 is formed over the sapphire substrate 80 by an MOVPE (Metal Organic Vapor Phase Epitaxy) method. Specifically, TMG (trimethylgallium) and $NH_3$ are supplied, thereby forming a buffer layer made of GaN. Subsequently, TMG, $NH_3$, and $SiH_4$ as dopant gas are supplied, thereby forming an n-type semiconductor layer made of n-type GaN. Then, a light emitting layer is formed over the n-type semiconductor layer. The light emitting layer may have a multi-quantum well structure formed of InGaN/GaN. In this case, with InGaN/GaN as one cycle, five cycles of growth are performed. Specifically, TMG, TMI (trimethylindium), and $NH_3$ are supplied, thereby forming an InGaN well layer, and then TMG and $NH_3$ are supplied, thereby forming a GaN barrier layer. By repeating this process five cycles, the light emitting layer is formed. Then, TMG, TMA (trimethylaluminum), $NH_3$, and $Cp_2Mg$ (bis-cyclopentadienyl Mg) as a dopant are supplied, thereby forming a p-type AlGaN clad layer. Subsequently, TMG, $NH_3$, and $Cp_2Mg$ as a dopant are supplied, thereby forming a p-type semiconductor layer constituted by a p-type GaN layer (FIG. 4A).

(Light-Reflecting Layer Forming Process)

Figure 4B:
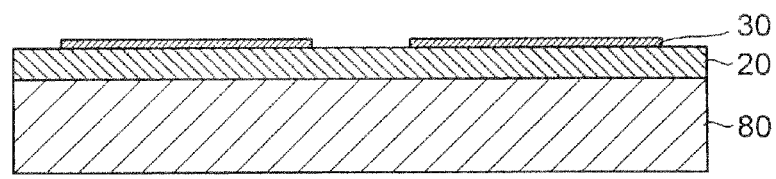

After an Ag film of about 150 nm thickness is formed over the surface of the semiconductor film 20 (the p-type semiconductor layer) by a sputtering method or the like, unnecessary parts of the Ag film are removed, thereby patterning the Ag film to form the light-reflecting layer 30. By the patterning, the light-reflecting layer 30 is divided into respective sections for light emitting elements (FIG. 4B).

(Division Groove Forming Process)

Figure 4C:
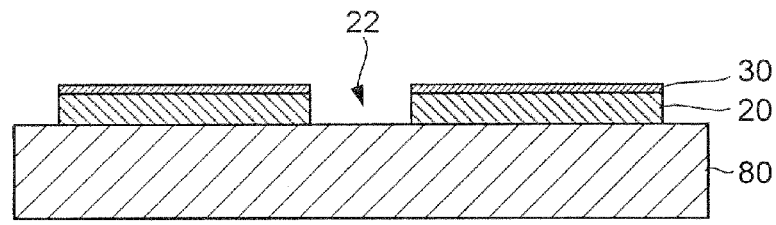

Division grooves 22 to define respective sections for light emitting elements are formed in the semiconductor film 20. Specifically, a resist (not shown) having a lattice-like opening pattern corresponding to the pattern of the division grooves 22 is formed on the surface of the semiconductor film 20. Then, the wafer is put in an RIE (reactive ion etching) apparatus, and the parts of the semiconductor film 20 exposed through the openings of the resist are etched by dry etching using $Cl_2$ plasma to form the lattice-like division grooves 22 reaching the sapphire substrate 80 in the semiconductor film 20. The formation of the division grooves 22 divides the semiconductor film 20 into squares with a side length of, e.g., 1.05 µm (FIG. 4C).

(Support Substrate Bonding Process)

Figure 4D:
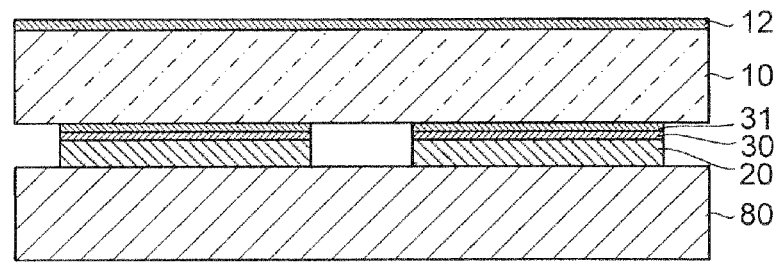

A conductive Si substrate is prepared as the support substrate 10. A bonding layer 31 containing eutectic bonding material such as AuSn is formed over the surface of the support substrate 10 to which the semiconductor film 20 is to be bonded. A Pt layer or the like forming the back surface electrode 12 is provided over the other surface of the support substrate 10. The light-reflecting layer 30 formed on the semiconductor film 20 and the bonding layer 31 formed on the support substrate 10 are put in close contact and, being compressed, heated at about 250° C. so that the support substrate 10 and the semiconductor film 20 are bonded together (FIG. 4D).

(Growth Substrate Removing Process)

Figure 5A:
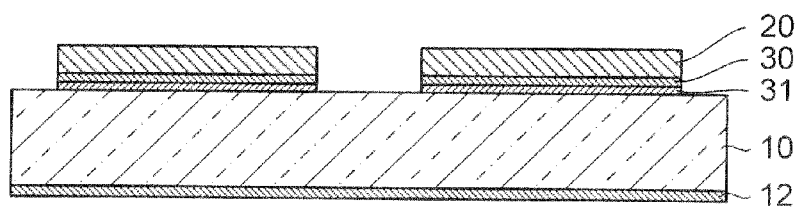
FIGS. 5A and 5B are cross-sectional views showing the manufacturing method of the semiconductor light emitting device according to the embodiment of the present invention.

The sapphire substrate 80 is separated from the semiconductor film 20. A laser lift-off method can be used to separate the sapphire substrate 80. Specifically, excimer laser is irradiated onto the sapphire substrate 80 from the back surface side (the opposite side from the surface on which the semiconductor layer 20 is formed). Thereby, the GaN crystal adjacent to the interface with the sapphire substrate 80 is decomposed into Ga and $N_2$ gas, and the sapphire substrate 80 is separated from the semiconductor film 20 (FIG. 5A).

(Light Emitting Element Dividing-into Process)

Figure 5B:
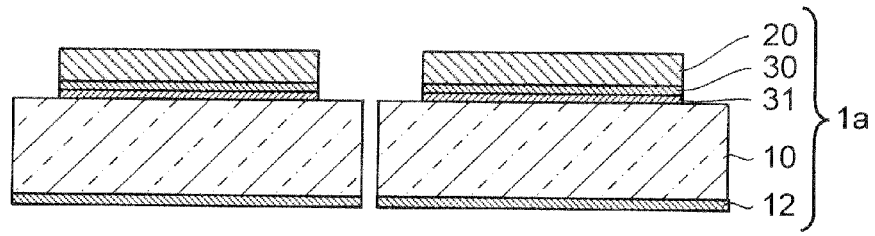

After metal such as Au, Ag, or Al is deposited by a sputtering method or the like over the surface of the semiconductor layer 20 exposed by separating the sapphire substrate 80, this metal is patterned by photolithography to form bonding pads (not shown) on the surface of the semiconductor layer 20. Then, the support substrate 10 is cut along the division grooves 22 by dicing or the like, thereby dividing the laminated body including the support substrate 10 and the semiconductor layer 20 into chips (hereinafter the divided laminated chip is called a light emitting element). The support substrate 10 is divided such that its support surface supporting the semiconductor film 20 is larger in size than the principal surface of the semiconductor film 20. The distance from the side surfaces of the semiconductor film 20 to the edges (cross sections) of the support substrate 10 is, for example, about 100 µm (FIG. 5B).

(Light Emitting Element Mounting Process)

Figure 6A:
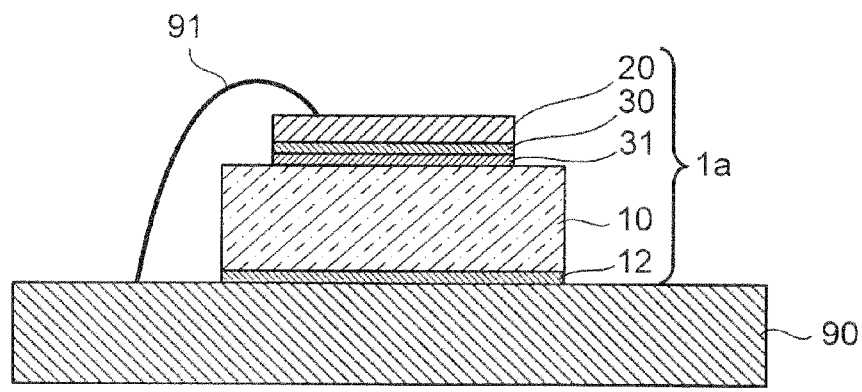
FIGS. 6A to 6C are cross-sectional views showing the manufacturing method of the semiconductor light emitting device according to the embodiment of the present invention.

The light emitting element 1a formed through the above processes, which includes the support substrate 10 and the semiconductor film 20, is mounted on a package substrate 90. In order to bond the package substrate 90 and the light emitting element 1a together, for example, a conductive adhesive such as solder or Ag paste can be used. The back surface electrode 12 is electrically connected to a die pad (not shown) formed on the package substrate 90. Then, a bonding pad (not shown) formed on the upper surface of the semiconductor film 20 and a conductor line (not shown) formed on the package substrate 90 are connected with a bonding wire 91 (FIG. 6A).

(Light-Shielding Part Forming Process)

Figure 6B:
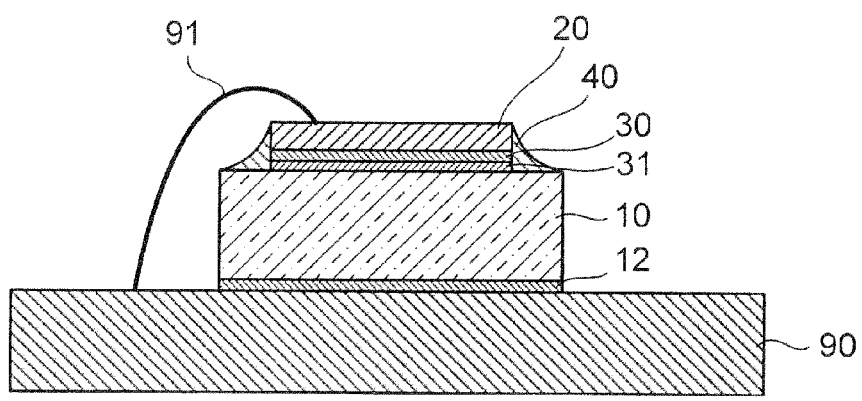

White resin that is a mixture of silicone resin and light-scattering particles of $TiO_2$ or the like is prepared as light-shielding material. The white resin is coated over the area around the semiconductor film 20 by a dispense method or the like to cover the side surfaces of the semiconductor film 20 and the support surface of the support substrate 10 extending outside the semiconductor film 20. By scanning a dispensing nozzle along the periphery of the semiconductor film 20, the white resin is supplied into the area between the side surfaces of the semiconductor film 20 and the edges of the support substrate 10 to surround the periphery of the semiconductor film 20. The white resin crawls up the side surfaces of the semiconductor film 20 to form a concave-like sloping surface sloping down from the side surfaces of the semiconductor film 20 toward the edges of the support substrate 10 due to the action of surface tension. Thereafter, the white resin is cured by thermal treatment or the like, thereby forming the light-shielding part 40 (FIG. 6B). Note that epoxy resin, hybrid resin, urethane resin, or the like can be used as the resin material for the light-shielding part 40. Further, $Al_2O_3$ or the like can be used as the light-scattering particle material.

(Wavelength Converting Part Forming Process)

Wavelength converting material that is light-transmissive resin such as epoxy resin or silicone resin having a YAG:Ce fluorescent substance dispersed therein is prepared. The wavelength converting material is coated over the semiconductor film 20 by the dispense method or the like. The wavelength converting material spreads to the edges of the support substrate 10. The semiconductor film 20 and the light-shielding part 40 are buried in the wavelength converting material. The wavelength converting material forms a curved surface shape like a dome (or a convex) in which the thickness increases when going from the edges of the support substrate 10 toward the center of the semiconductor film 20. The entire area of the semiconductor film 20 including its corners is covered by the portion of relatively large thickness of the wavelength converting material.

Figure 6C:
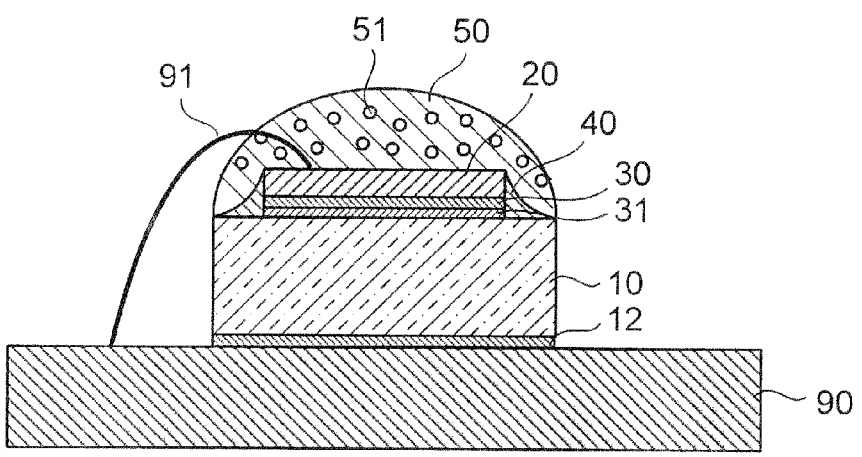
Figure 7:
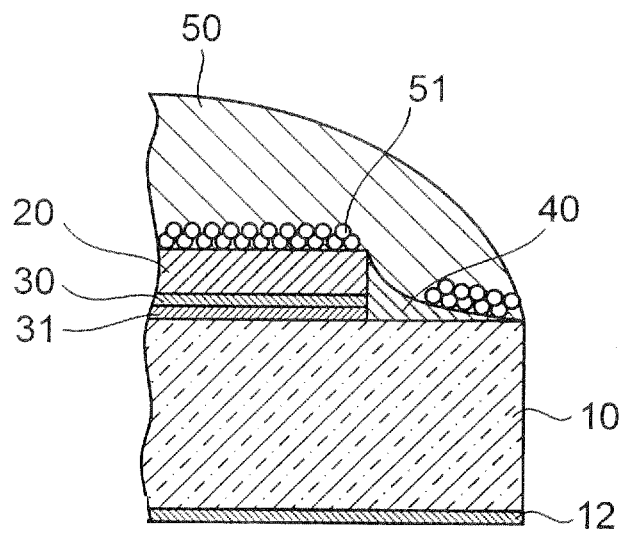
FIG. 7 is a cross-sectional view of part of the semiconductor light emitting device according to the embodiment of the present invention.

After the wavelength converting material is coated, it may be left for some time, thereby let the fluorescent substance sink down in the light-transmissive resin. In this case, the fluorescent substance 51 is deposited on the semiconductor film 20 and the light-shielding part 40 as shown in FIG. 7. By letting the fluorescent substance sink down, the density of the fluorescent substance can be made generally uniform across the thick portion and the thin portion of the wavelength converting material, resulting in a reduction in unevenness in emission color. Further, by putting the fluorescent substance in contact with the semiconductor film 20, heat generated when the fluorescent substance is excited can be released to the outside via the semiconductor film 20, the support substrate 10, and the package substrate 90. Yet further, by letting the fluorescent substance sink down, the effect of leading unnecessary fluorescent substance particles to far from the semiconductor film 20 with use of the sloping surface of the light-shielding part 40 is promoted. After letting the fluorescent substance sink down, the wavelength converting material is cured by thermal treatment or the like to form the wavelength converting part 50 (FIG. 6C). Having undergone the above processes, the semiconductor light emitting device 1 is finished.

When the emission color of the semiconductor light emitting device 1 according to the embodiment of the present invention was observed, the emission of blue light in the corners of the semiconductor film, which was observed with conventional semiconductor light emitting devices, had been eliminated, and light without color unevenness was obtained over the entire area. This was because in the semiconductor light emitting device 1 according to the embodiment of the present invention the edges of the support substrate 10 are located outside the semiconductor film 20 in plan view with the area covered by the wavelength converting part 50 extending to the edges of the support substrate 10, resulting in the thickness of the wavelength converting part 50 on the corners of the semiconductor film 20 being sufficient. Further, strongly yellowish light was not generated in the area around the semiconductor film 20. This was because by covering the side surfaces of the semiconductor film 20 with the light-shielding part 40, light emission from the side surfaces of the semiconductor film 20 is cut off and because by forming a sloping surface in the light-shielding part 40, fluorescent substance particles existing over the area around the semiconductor film 20 and not contributing to the generation of white light are led to outer positions lower than the upper surface of the semiconductor film 20 so as not to be irradiated by blue light.

Figure 8:
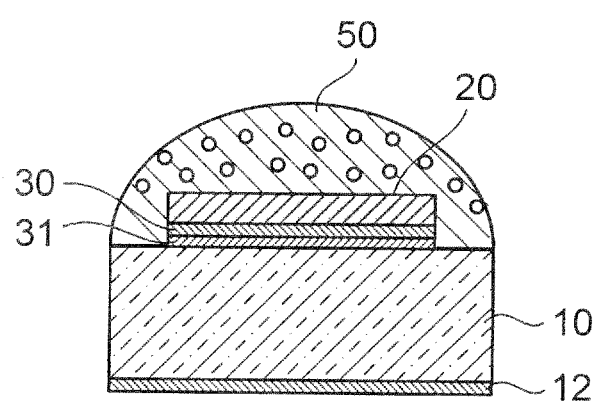
FIG. 8 is a cross-sectional view showing the configuration of a semiconductor light emitting device as a comparative example.

Table 1 shows results of comparing the light outputs at the forward current=0.35 A of the semiconductor light emitting device 1 according to the embodiment of the present invention and a semiconductor light emitting device according to a comparative example shown in FIG. 8. The semiconductor light emitting device according to the comparative example differs from the semiconductor light emitting device 1 according to the embodiment of the present invention in that the side surfaces of the semiconductor film 20 are not covered by the light-shielding part and that Si, the base material of the support substrate 10, is exposed at the support surface of the support substrate 10 extending outside the semiconductor film 20. It was confirmed that with the semiconductor light emitting device 1 according to the embodiment of the present invention, luminous flux (lm) and Rf efficiency (lm/mW) were improved over the device of the comparative example. The Rf efficiency is the luminous flux (lm) of white light divided by the output (mW) of blue light emitted from the light emitting layer and is used as an index indicating conversion efficiency from blue light to white light. Table 1 shows the relative ratios of the luminous flux and Rf efficiency of the semiconductor light emitting device 1 according to the embodiment of the present invention with the luminous flux and Rf efficiency of the semiconductor light emitting device according to the comparative example as references (1.00). Higher light output having been obtained with the semiconductor light emitting device 1 according to the embodiment of the present invention as above, is because the light-reflective, light-shielding part 40 is provided so as to cover the side surfaces of the semiconductor film 20 and the support surface of the support substrate 10, thereby increasing light directed toward the principal surface of the semiconductor film 20 and reducing light absorption at the support surface of the support substrate 10.

As such, with the semiconductor light emitting device 1 according to the embodiment of the present invention, unevenness in emission color can be eliminated and the light output can be improved.

TABLE 1

|  | Luminous Flux | Rf Efficiency |
|---|---|---|
| Embodiment | 1.06 | 1.04 |
| Comparative Example | 1.00 | 1.00 |

Embodiment 2

Figure 9A:
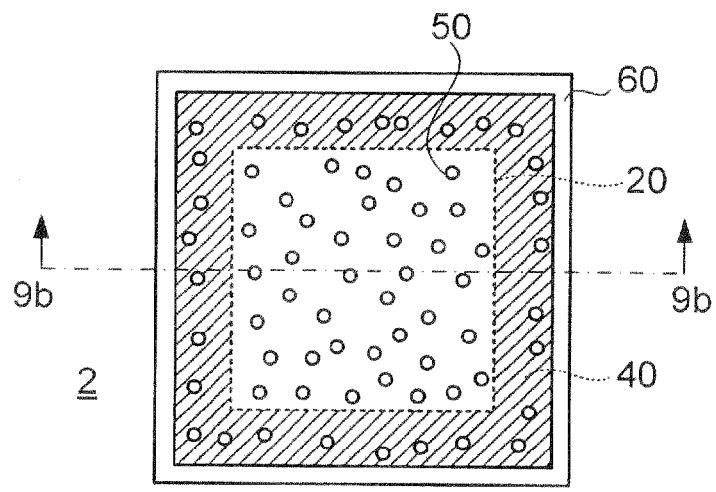
FIG. 9A is a top view of a semiconductor light emitting device according to an embodiment of the present invention.
Figure 9B:
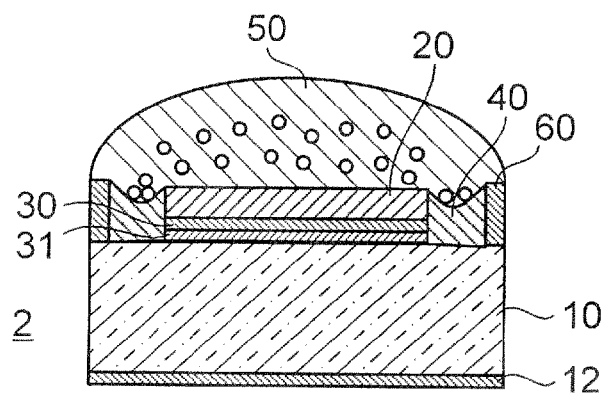
FIG. 9B is a cross-sectional view taken along line 9b-9b in FIG. 9A.
Figure 9C:
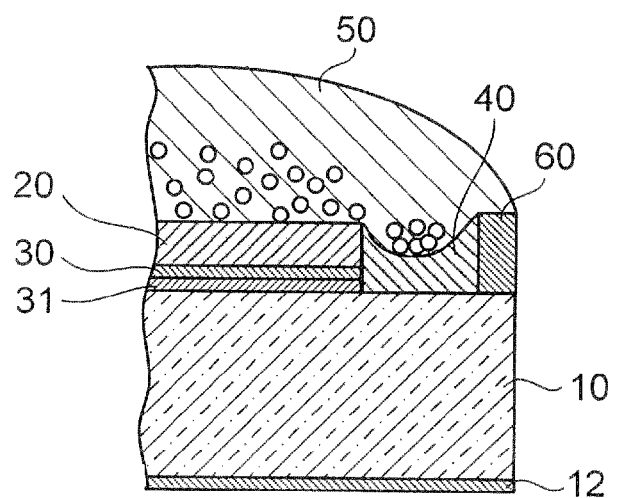
FIG. 9C is a cross-sectional view of part of the semiconductor light emitting device according to the embodiment of the present invention.

FIG. 9A is a top view of a semiconductor light emitting device 2, seen from the light extraction surface side, according to Embodiment 2 of the present invention; FIG. 9B is a cross-sectional view taken along line 9b-9b in FIG. 9A; and FIG. 9C is a cross-sectional view of part of the semiconductor light emitting device 2.

The semiconductor light emitting device 2 differs from the semiconductor light emitting device 1 according to the above embodiment 1 in that it has an annular frame 60 provided on the support substrate 10 along the edges of the support substrate. The annular frame 60 forms a wall surface surrounding the periphery of the semiconductor film 20. The light-shielding part 40 is formed by coating white resin between the wall surface of the annular frame 60 and the side surfaces of the semiconductor film 20. When white resin is supplied between the wall surface of the annular frame 60 and the side surfaces of the semiconductor film 20, the white resin crawls up the side surfaces of the semiconductor film 20 and the wall surface of the annular frame 60. The light-shielding part 40 forms a concave-like curved surface with its bottom in the middle between the semiconductor film 20 and the annular frame 60. Unnecessary fluorescent substance particles not contributing to the generation of white light are gathered at the bottom of the concave-like curved surface of the light-shielding part 40. That is, as in the semiconductor light emitting device 1 according to Embodiment 1, fluorescent substance particles existing over the area around the semiconductor film 20 and not contributing to the generation of white light are led to outer positions lower than the upper surface of the semiconductor film 20 so as not to be irradiated by blue light, thus preventing the excessive generation of yellow light in the area around the semiconductor film 20.

The annular frame 60 is preferably light-reflective and is formed by bonding a ceramic member or a plastic member shaped annularly by a method such as compression molding or cutting work onto the support substrate 10. Or, the annular frame 60 may be formed integrally with the support substrate 10 by etching or the like. By providing the annular frame 60, the white resin can be coated without running off the edges of the support substrate 10, thus contributing to improvement in production yield. Also with the semiconductor light emitting device 2 according to Embodiment 2, unevenness in emission color can be eliminated and the light output can be improved as with the semiconductor light emitting device 1 according to the above embodiment 1.

This application is based on Japanese Patent Application No. 2011-253442 which is herein incorporated by reference.

What is claimed is:
1. A semiconductor light emitting device comprising:
a semiconductor film including a light emitting layer;
a support substrate bonded to said semiconductor film via a light-reflecting layer and having a support surface sup- porting said semiconductor film and edges located further out than the side surfaces of said semiconductor film;
a light-shielding part that covers the side surfaces of said semiconductor film and part of said support surface extending outside said semiconductor film in plan view; and
a wavelength converting part containing a fluorescent substance and provided over said support substrate to bury said semiconductor film and said light-shielding part therein,
wherein said wavelength converting part has a curved surface shape in which its thickness increases when going from said edges toward the center of said semiconductor film.

2. A semiconductor light emitting device according to claim 1, wherein said light-shielding part forms a sloping surface sloping down from the side surfaces of said semiconductor film toward the edges of said support substrate.

3. A semiconductor light emitting device according to claim 1, wherein the distance from said edges to the side surfaces of said semiconductor film is larger than particle diameters of said fluorescent substance.

4. A semiconductor light emitting device according to claim 2, wherein the distance from said edges to the side surfaces of said semiconductor film is larger than particle diameters of said fluorescent substance.

5. A semiconductor light emitting device according to claim 1, wherein said light-shielding part has light-reflectiveness.

6. A semiconductor light emitting device according to claim 2, wherein said light-shielding part has light-reflectiveness.

7. A semiconductor light emitting device according to claim 3, wherein said light-shielding part has light-reflectiveness.

8. A semiconductor light emitting device according to claim 4, wherein said light-shielding part has light-reflectiveness.

9. A semiconductor light emitting device according to claim 5, wherein said light-shielding part is made of white resin containing light-scattering material.

10. A semiconductor light emitting device according to claim 6, wherein said light-shielding part is made of white resin containing light-scattering material.

11. A semiconductor light emitting device according to claim 7, wherein said light-shielding part is made of white resin containing light-scattering material.

12. A semiconductor light emitting device according to claim 8, wherein said light-shielding part is made of white resin containing light-scattering material.

13. A semiconductor light emitting device according to claim 2, wherein said sloping surface of said light-shielding part is a concave-like curved surface.

14. A semiconductor light emitting device according to claim 1, wherein said fluorescent substance exists on said sloping surface of said light-shielding part.

15. A semiconductor light emitting device according to claim 1, further comprising:
an annular frame forming a wall surface surrounding said semiconductor film on said support substrate,
wherein said light-shielding part is provided between the wall surface of said annular frame and the side surfaces of said semiconductor film.

16. A manufacturing method of a semiconductor light emitting device, comprising the steps of:
preparing a light emitting element that includes a semiconductor film including a light emitting layer, and a support substrate bonded to said semiconductor film via a light-reflecting layer and having a support surface supporting said semiconductor film and edges located further out than the side surfaces of said semiconductor film;
supplying light-shielding material between the side surfaces of said semiconductor film and said edges to form a light-shielding part to cover the side surfaces of said semiconductor film; and
after forming said light-shielding part, coating a wavelength converting material containing a fluorescent substance over said semiconductor film so as to spread to said edges, thereby forming a wavelength converting part to bury said semiconductor film therein.

17. A manufacturing method according to claim 16, wherein said light-shielding material is made of white resin containing light-scattering material.

18. A manufacturing method according to claim 17, wherein said light-shielding material forms a sloping surface sloping down from the side surfaces of said semiconductor film toward said edges due to surface tension.

19. A manufacturing method according to claim 16, wherein said wavelength converting material is made of light-transmissive resin containing a fluorescent substance and is cured after said fluorescent substance sinks down in said light-transmissive resin to be deposited on said semiconductor film.

* * * * *